(12) United States Patent
Liao

(10) Patent No.: US 7,789,693 B2
(45) Date of Patent: Sep. 7, 2010

(54) SOCKET ASSEMBLY WITH EASILY ASSEMBLED LOADING MECHANISM

(75) Inventor: Fang-Jwu Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/485,065

(22) Filed: Jun. 16, 2009

(65) Prior Publication Data

US 2009/0311902 A1    Dec. 17, 2009

(30) Foreign Application Priority Data

Jun. 16, 2008    (TW)    ................. 097210598

(51) Int. Cl.
*H01R 13/62*    (2006.01)
(52) U.S. Cl. ..................................... 439/331
(58) Field of Classification Search ................. 439/331, 439/330, 354, 355, 358
See application file for complete search history.

(56) References Cited

U.S. PATENT DOCUMENTS 6,752,645 B2 *    6/2004    Nakamura et al. .......... 439/330
7,001,197 B2    2/2006    Shirai et al.
7,588,452 B2 *    9/2009    Yeh ............................ 439/331
2010/0087073 A1 *    4/2010    Fan et al. ................... 439/76.1

FOREIGN PATENT DOCUMENTS

TW    M328108    3/2008

\* cited by examiner

*Primary Examiner*—Chandrika Prasad
(74) *Attorney, Agent, or Firm*—Andrew C. Cheng; Wei Te Chung; Ming Chieh Chang

(57) ABSTRACT

A socket assembly for electrically connecting an IC package to a printed circuit board, comprises an insulative housing, at least two retainers mounted on the printed circuit board and a loading plate. The insulative housing defines a receiving space for the IC package. The retainers are mounted on the printed circuit board and located on two sides of the insulative housing, and the retainer has a latching portion with a latching slot. The loading plate is mounted above the insulative housing and has two opposite lateral portions retained in the latching slot of the retainer, respectively, to retain the loading plate.

18 Claims, 5 Drawing Sheets

SOCKET ASSEMBLY WITH EASILY ASSEMBLED LOADING MECHANISM

FIELD OF THE INVENTION

The present invention relates to a socket assembly, and more particularly to a socket assembly with snap-in clip in which the clip can be readily and snuggly snapped into a pair of anchors and released therefrom when necessary.

DESCRIPTION OF RELATED ART

Socket assembly is widely used to be disposed between an IC package and a printed circuit board and electrically connects with the IC package and the printed circuit board, respectively, for transferring signals between the IC package and the printed circuit board.

A typical socket assembly for electrically connecting an IC package to a printed circuit board is described in U.S. Pat. No. 7,001,197, issued to Shirai et al. on Feb., 21, 2006. The socket assembly comprises an insulative housing mounted on a printed circuit board, a plurality of contacts received in the insulative housing, a metalliclic stiffener surrounding the insulative housing, a load plate pivotally assembled to an end of the stiffener and a lever pivotally assembled to the other end of the stiffener. When the IC package is put in the insulative housing, the load plate rotates downwardly to cover the IC package, finally the lever is actuated to press against the stiffener to make sure reliably connection between the IC package and the contacts received in the insulative housing. However, this type socket needs enough room to operate the lever, so it is only adapted for desktop computer, but not for notebook computer.

TW Patent No. M328108, issued to Ma et al. on Mar. 1, 2008, discloses another socket assembly, which has an insulative housing with a plurality of contact, and a loading plate disposed upon the insulative housing and pressing an IC package received in an insulative housing. The loading plate has four mounting legs extending from four corners thereof and downwardly to close to the printed circuit board, and each mounting leg has a mounting hole for a screw passing through. In virtue of engagement between screws and nuts, the loading plate is attached to the printed circuit board and presses the IC package downwardly to ensure reliably electrically connection between the IC package and the contacts. However, to ensure that the loading plate can provide a balanced downward force on the IC package, an assembly of the screws mounting the mounting legs of the loading plate is too complicated to make, and it requires a tight manufacturing clearance, if any one of the mounting legs is pressed too tightly by the screw, the other three mounting legs will rise (be pried/tilted) upwardly. As a result, the loading plate can not evenly distribute the downward force across the IC package.

Hence, an improved socket assembly is required to overcome the above-mentioned disadvantages of the related art.

SUMMARY OF THE INVENTION

An object of the present invention is to provide an easily assembled socket assembly while the downward force is evenly distributed across an IC package.

To achieve the aforementioned objects, a socket assembly for electrically connecting an IC package to a printed circuit board, comprises an insulative housing, at least two retainers and a loading plate. The insulative housing defines a receiving space for the IC package. The retainers are mounted on the printed circuit board and located on two sides of the insulative housing, and each of the retainers has a latching portion. The loading plate is mounted above the insulative housing and has two opposite lateral portions retained by the latching portions of the retainer, respectively, to retain the loading plate.

Other objects, advantages and novel features of the invention will become more apparent from the following detailed description of a preferred embodiment when taken in conjunction with the accompanying drawings.

DETAILED DESCRIPTION OF THE INVENTION

Figure 1:
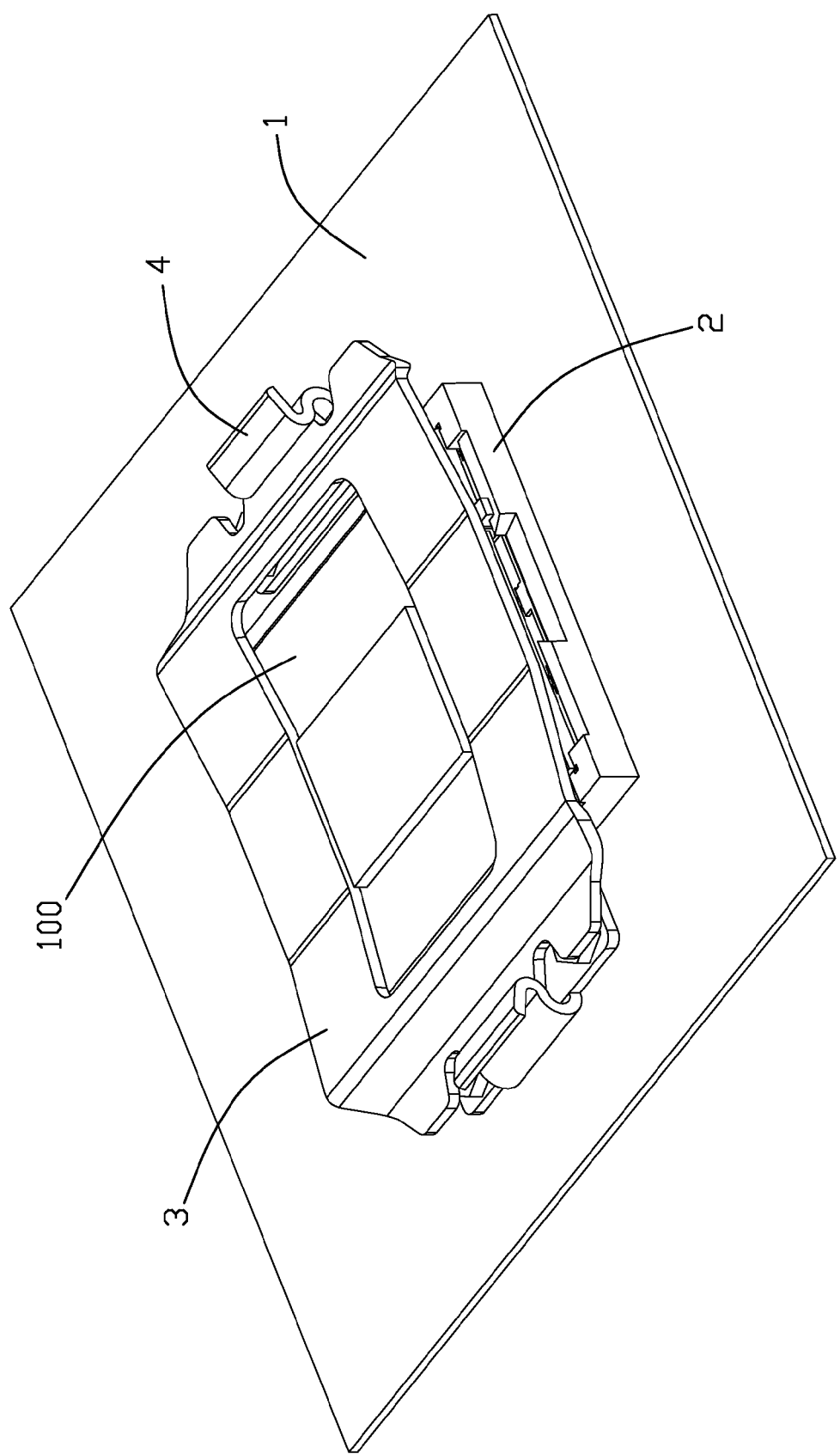
FIG. 1 is an assembled, perspective view of a socket assembly in accordance with the present invention, wherein the socket assembly receives an IC package and is mounted on a printed circuit board.

Reference will now be made to the drawing figures to describe the present invention in detail. Referring to FIGS. 1-5, a socket assembly in accordance with the preferred embodiment of the present invention is adapted for electrically connecting an IC package 100 and a printed circuit board 1. The socket assembly comprises an insulative housing 2, a loading plate 3, a pair of retainer 4 for retaining the loading plate 3, a backplane 5 and a plurality of nuts 61 and screws 62.

Figure 2:
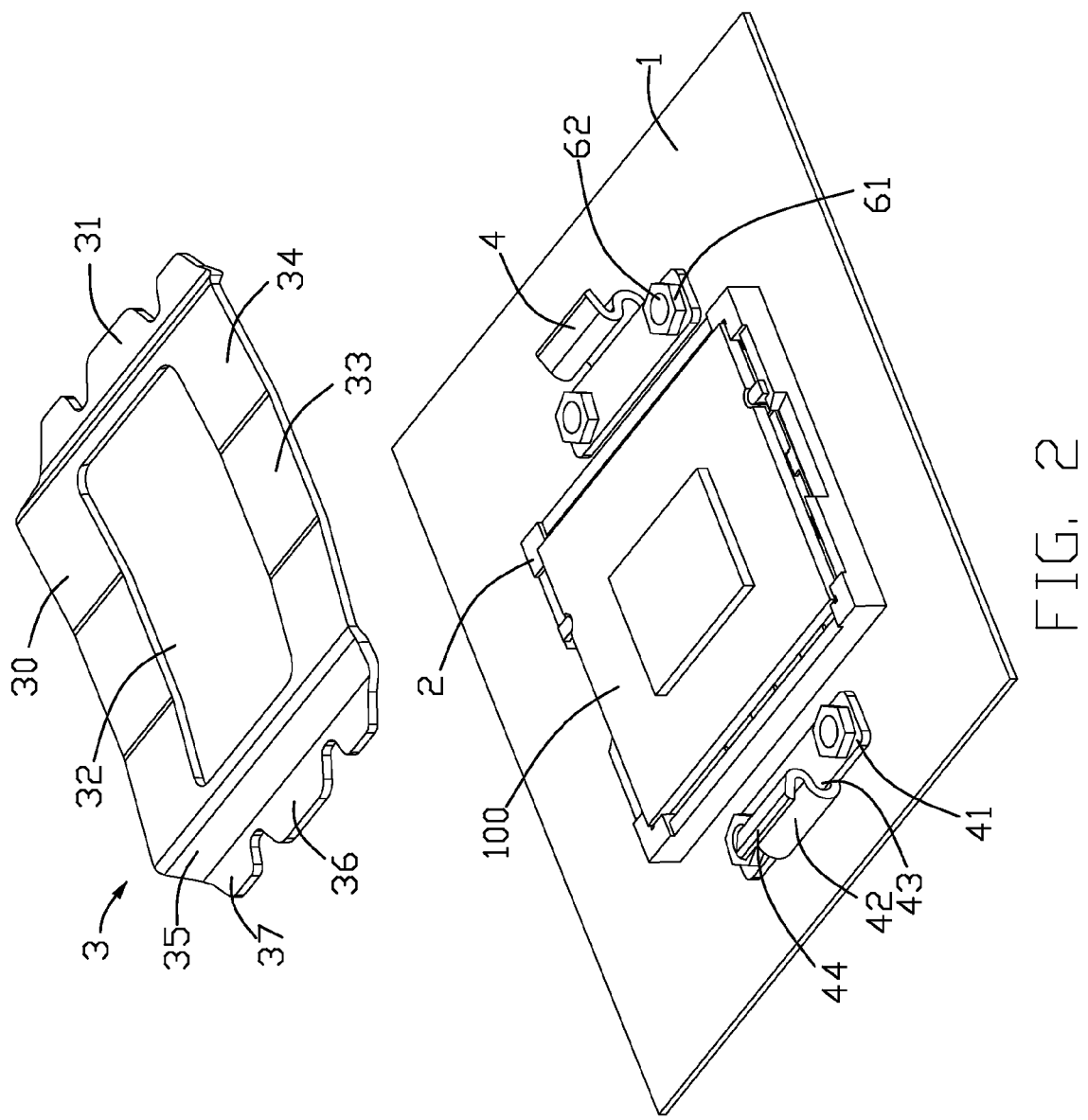
FIG. 2 is similar with FIG. 1, wherein a loading plate of the socket is removed.
Figure 3:
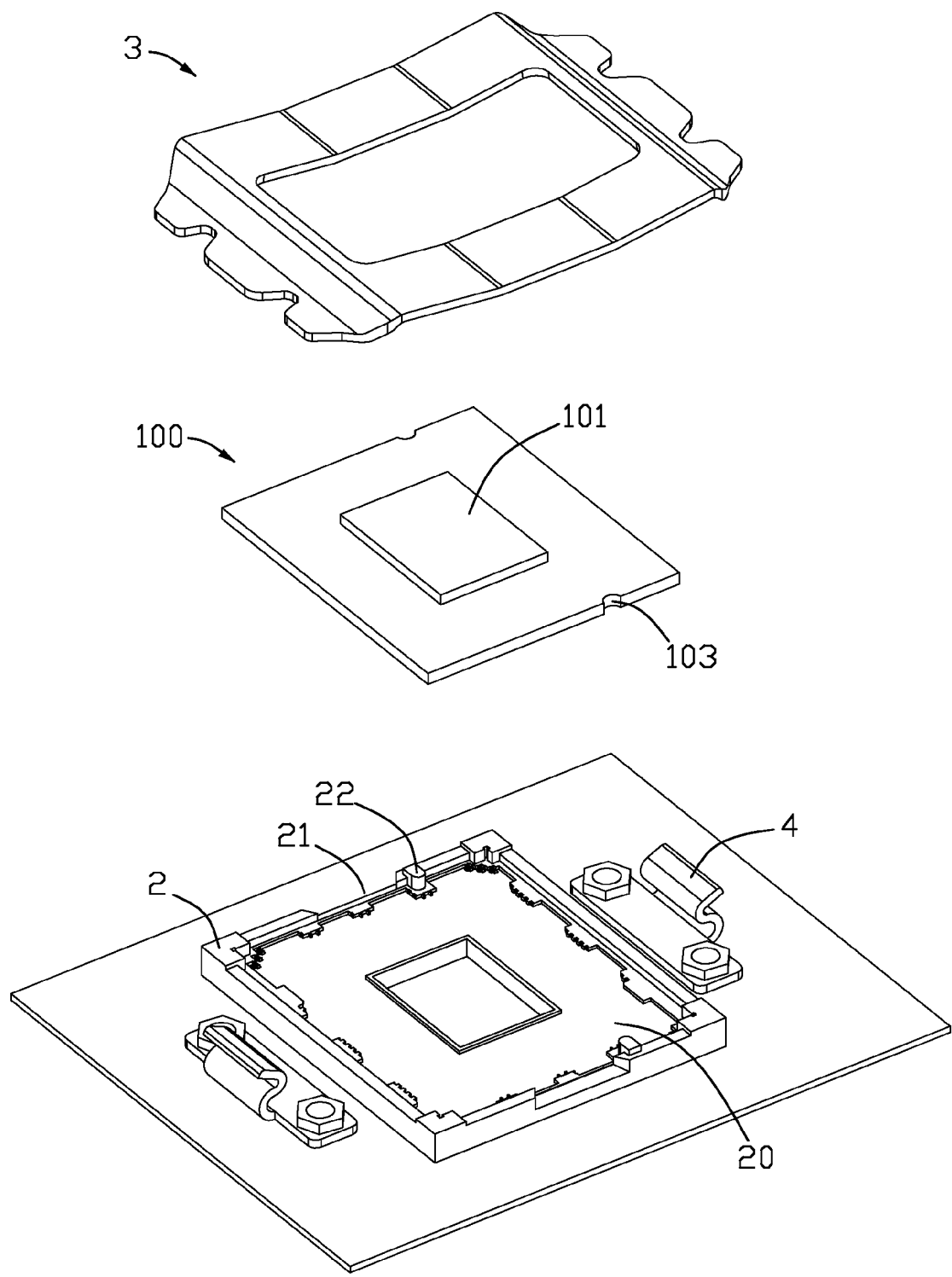
FIG. 3 is similar with FIG. 2, wherein the IC package is further removed from the socket assembly.

Referring to FIG. 2 and FIG. 3, the insulative housing 2 has a rectangular configuration and is molded by resin. A plurality of contacts (not shown) are received within the insulative housing 2. The insulative housing 2 comprises a bottom wall (not shown) and a plurality of sidewalls 302 extending upright from a peripheral of the bottom wall. The bottom wall and the sidewalls together define a receiving space 20 for receiving the IC package 100 therein. Two opposite sidewalls each has a slot 21 on a middle thereof, thus operator can facilely remove the IC package 100 in the receiving space 20. The insulative housing 2 further has a pair of alignments 22 projecting from inner surfaces of the sidewalls toward the receiving space 20.

The IC package 100 has a rectangular embossed portion 101 in a central part thereof, and a pair of notches 103 on two opposite sides thereof to engage with the alignments 22 of the insulative housing 2 to prevent the IC package 100 from being mounted by error.

The loading plate 3 is stamped from a metallic sheet and located above the IC package 100 within the receiving space 20 to press the IC package 100 toward the housing. The loading plate 3 is formed with a main body 30 and two lateral portions 31 each extending from a longitudinal end of the main body 30. The main body 30 defines a longitudinal opening 32 in a central part thereof, the opening extends substantially across the whole main body 30 in a longitudinal direction. The main body 30 is provided with a substantially horizontal pressing portion 33 in a middle thereof along the longitudinal direction and two deflection portions 34 each deflecting upwardly from one of two opposite longitudinal ends of the pressing portion 33. The lateral portion 31 has a connecting portion 35 extending outwardly and downwardly from the main body 30, an engaging portion 36 extending outwardly and substantially horizontally from middle of the connecting portion 35 and two operating portion 37 extending outwardly and substantially horizontally from two ends of the connecting portion 35. The engaging portion 36 is disposed between the two operating portion 37, an out edge of the engaging portion 36 is slightly higher than that of the operating portion 37.

The retainer 4 is stamped from a metallic piece and mounted on the printed circuit board 2 beside two opposite sides of the insulative housing 3 and corresponding to the lateral portion 31 of the loading plate 3. The retainer 4 has a substantially rectangular slice 41 mounted on and against the printed circuit board 1, the slice 41 has a long side located along an extending direction of an adjacent sidewall (not labeled) of the insulative housing 2. The retainer 4 is formed with a latching portion 42 which firstly extends outwardly from an outside edge of the slice 41 to be away from the insulative housing 2 and then inwardly toward the insulative housing 2, so the latching portion 42 has a substantially horizontal U-shape section to define a latching slot 43 with an opening toward the insulative housing 2 for engaging with the loading plate 3. The latching portion 42 is further bent upwardly and outwardly from a free end thereof to form a guiding portion 44. The slice 41 further defines a pair of mounting holes 45 on two ends thereof for the screw 62 passing though.

Figure 4:
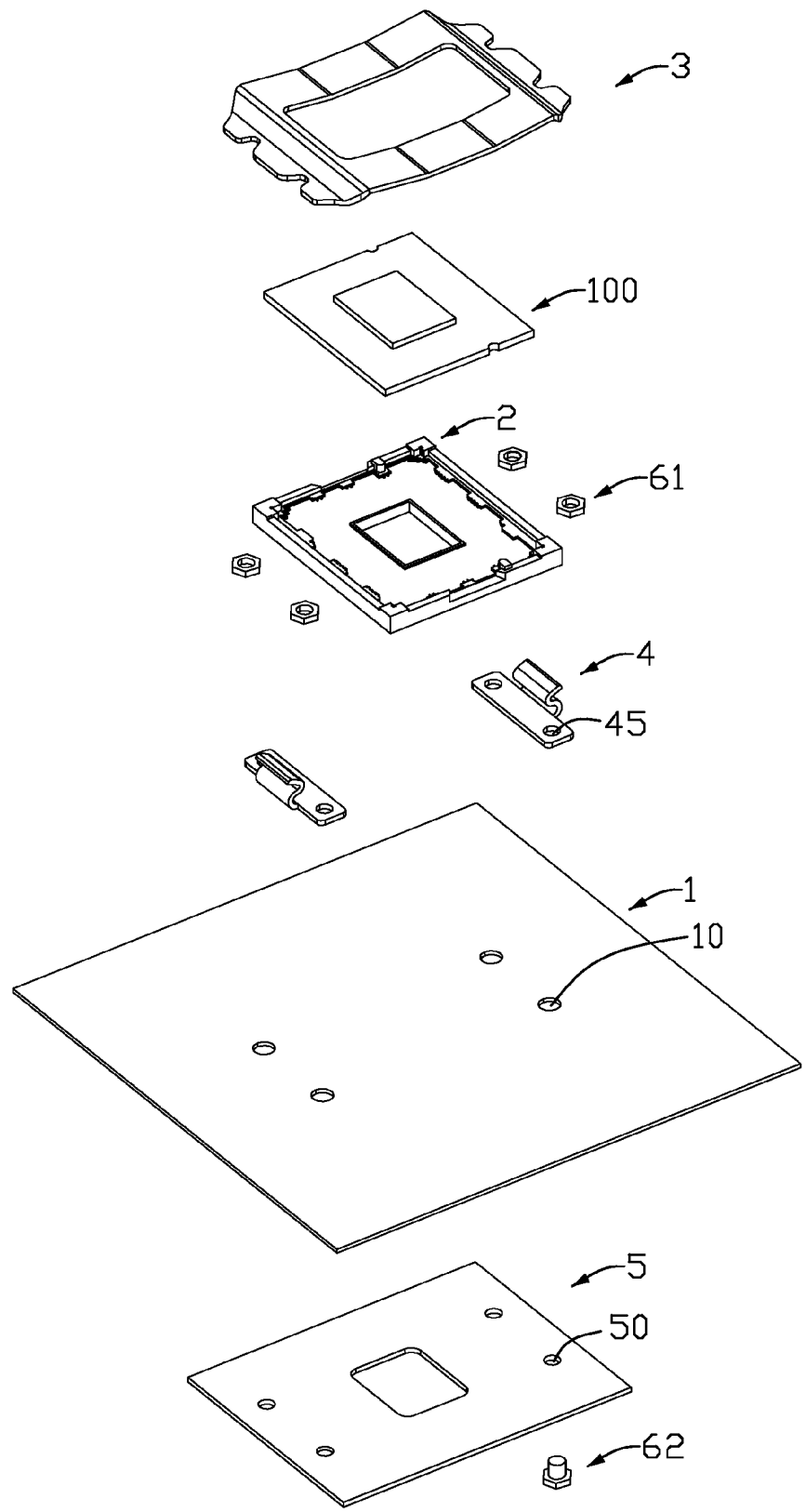
FIG. 4 is an exploded, perspective view of the socket assembly, the IC package and the printed circuit board in accordance with the present invention.
Figure 5:
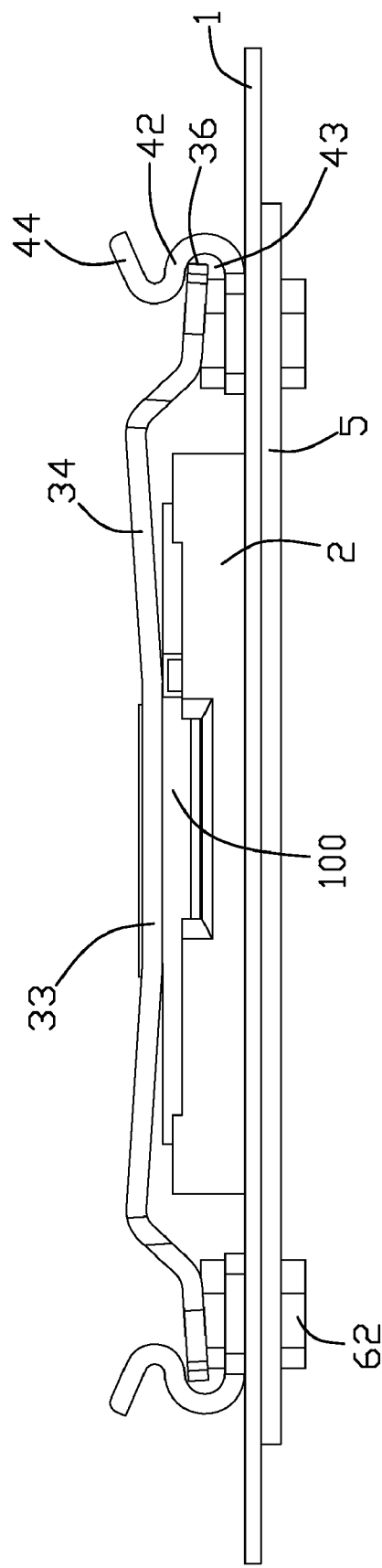
FIG. 5 is a front view of the socket assembly in FIG. 1.

Referring to FIG. 4, the printed circuit board 1 has a plurality of through holes 10, the backplane 5 is assembled to a bottom surface of the printed circuit board 1 and correspondingly has a plurality of apertures 50. Conjoined with FIGS. 1-3, when assembly, the screw 62 inserts into the aperture 50 of the backplane 5, the through hole 10 of the printed circuit board 1 and the mounting hole 45 of the retainer 4 in turn from a bottom side, then the nut 61 locks with the screw 62 from a top side, thus the retainer 4 and the backplane 5 is mounted on the printed circuit board 1. The insulative housing 2 is mounted on the printed circuit board 1 and disposed between the two retainers 4, the IC package 100 is put in the insulative housing 2. Finally, the loading plate 3 is retained by the retainer 4 located on two sides of the insulative housing 2 to cover and press the IC package 100.

When assembling the loading plate 3 into the retainers 4, firstly, the engaging portion 36 of one of the lateral portions 31 inserts into latching slot 43 of the corresponding retainer 4, and the operating portions 37 located at the same side press the nuts 61; then press the other operating portions 37 on the other lateral portion 31 downwardly, thus the other engaging portion 36 moves downwardly along the guiding portion 44 of the retainer 4 and simultaneously pushes the guiding portion 44 outwardly till the other engaging portion 36 enters into the latching slot 43 of the other retainer 4. Therefore, the loading plate 3 is assembled on the insulative housing 2.

The lateral portions 31 of the loading plate 3 are retained by the latching portions 42 of the retainers 4, and the deflection portions 34 of the main body 30 are pulled downwardly and deform, so the pressing portion 33 can provide an enough downward force, therefore ensure the IC package 100 can reliably contact with the contacts (not shown) within the insulative housing 2. The embossed portion 101 of the IC package 100 passes through the opening 32 of the loading plate 3. The loading plate 3 and the retainers 4 cooperatively forms an easily assembled loading mechanism, the socket assembly with this loading mechanism has a simplified configuration and an easy assembling process. Alternatively, the retainers 4 may more than two.

However, the disclosure is illustrative only, changes may be made in detail, especially in matter of shape, size, and arrangement of parts within the principles of the invention.

What is claimed is:

1. A socket assembly, for electrically connecting an IC package, comprising:
    an insulative housing defining a receiving space for the IC package;
    at least two retainers located on two opposite sides of the insulative housing, the retainer having a latching portion; and
    a loading plate mounted above the insulative housing, the loading plate having two opposite lateral portions retained by the latching portions of the retainer, respectively.

2. The socket assembly as claimed in claim 1, wherein each latching portion has a latching slot with an opening toward the insulative housing, the lateral portion is retained in the latching slot.

3. The socket assembly as claimed in claim 2, wherein the retainer has a slice mounted on a printed circuit board on which the insulative housing is mounted, the slice defines two mounting holes on two ends thereof for a screw passing through to retain the retainer on the printed circuit board.

4. The socket assembly as claimed in claim 3, wherein the latching portion extends from a side of the slice, the retainer has a guiding portion extending from a free end of the latching portion to guide the lateral portion of the loading plate moving into the latching slot.

5. The socket assembly as claimed in claim 4, wherein the latching portion extends upwardly and simultaneously outwardly to be away from the insulative housing and then inwardly, so the latching portion has a lying U-shape section.

6. The socket assembly as claimed in claim 5, wherein the guiding portion of the retainer is upwardly and outwardly bent from the free end of the latching portion.

7. The socket assembly as claimed in claim 1, wherein the receiving space receives the IC package, the insulative housing has a plurality of contacts electrically connecting with the IC package.

8. The socket assembly as claimed in claim 7, wherein the loading plate has a main body positioned upon the IC package, the main body has a pressing portion in a middle thereof and two deflection portions extending upwardly from two ends of the pressing portion, when the loading plate is retained by the retainer, the deflection portions deform so the pressing portion can reliably press the IC package.

9. The socket assembly as claimed in claim 8, wherein the lateral portion of the loading plate has a connecting portion extending downwardly from the main body and an engaging portion further substantially horizontally extending from the connecting portion, the latching portion defines a latching slot with an opening toward the insulative housing, the engaging portion of the loading plate is retained in the latching slot.

10. The socket assembly as claimed in claim 9, wherein the loading plate has two operating portions extending outwardly from two ends of the connecting portion, the engaging portion is disposed between the operating portions.

11. A socket assembly, for electrically connecting an IC package to a printed circuit board, comprising:
    an insulative housing defining a receiving space for the IC package;
    a pair of retainers, located on two sides of the insulative housing, each retainer having a latching slot with an opening toward the insulative housing; and a loading plate for pressing the IC package, the loading plate having two opposite lateral portion retained in the latching slot.

12. The socket assembly as claimed in claim 11, wherein the retainer has a slice mounted on the printed circuit board, the slice defines two mounting holes on two ends thereof for a screw passing through to retain the retainer on the printed circuit board.

13. The socket assembly as claimed in claim 12, wherein the retainer has a latching portion extending from a side of the slice and defining the latching slot, the retainer is formed with a guiding portion extending from a free end of the latching portion to guide the lateral portion of the loading plate moving into the latching slot.

14. The socket assembly as claimed in claim 13, wherein when assembling the loading plate, one lateral portion of the loading plate firstly inserts into the latching slot, and the other lateral portion is guided by the guiding portion of the other retainer and enters into the latching slot of the other retainer.

15. The socket assembly as claimed in claim 14, wherein the loading plate has two operating portions which are pressed by the operator to make the lateral portion move downwardly.

16. An electrical connector assembly comprising:
a printed circuit board;
an insulative housing of an electrical connector mounted upon the printed circuit board;
a CPU mounted upon the housing;
a pair of deflectable retainers mounted upon the printed circuit board about two opposite ends of the housing along a front-to-back direction;
a metallic loading plate have two free ends along said front-to-back direction, said two free ends being respectively downwardly pressed by the retainers and being able to be completely released from the retainers so as to completely remove the loading plate from both the housing and the retainers.

17. The electrical connector assembly as claimed in claim 16, wherein said loading plate is essentially symmetrically arranged with regard to a center line between said two opposite ends.

18. The electrical connector assembly as claimed in claim 16, wherein said housing is configured to restrain lateral movement of the loading plate when said loading plate is pressed downwardly by said pair of retainers.

* * * * *